United States Patent
Aoyagi (10) Patent No.: US 7,190,063 B2
(45) Date of Patent: Mar. 13, 2007

(54) SEMICONDUCTOR DEVICE AND METHOD OF MANUFACTURING THE SAME, CIRCUIT BOARD, AND ELECTRONIC APPARATUS

(75) Inventor: Akiyoshi Aoyagi, Sagamihara (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/962,157

(22) Filed: Oct. 8, 2004

(65) Prior Publication Data

US 2005/0110158 A1    May 26, 2005

(30) Foreign Application Priority Data

Oct. 9, 2003    (JP)    ............................. 2003-350901

(51) Int. Cl.
*H01L 23/02* (2006.01)

(52) U.S. Cl. ............... 257/686; 257/777; 257/778; 257/779; 257/780

(58) Field of Classification Search ............... 257/678, 257/685, 686, 777–780, E23.169
See application file for complete search history.

(56) References Cited

U.S. PATENT DOCUMENTS

| | | | |
|---|---|---|---|
| 5,222,014 A | | 6/1993 | Lin |
| 5,598,036 A | * | 1/1997 | Ho ............................. 257/738 |
| 5,659,203 A | * | 8/1997 | Call et al. .................... 257/778 |
| 5,994,166 A | * | 11/1999 | Akram et al. ................ 438/108 |
| 6,239,383 B1 | * | 5/2001 | Lin .............................. 174/260 |
| 6,285,079 B1 | * | 9/2001 | Kunikiyo ..................... 257/737 |
| 6,657,124 B2 | * | 12/2003 | Ho ............................. 174/52.4 |
| 6,700,209 B1 | * | 3/2004 | Raiser et al. ................ 257/790 |
| 6,781,241 B2 | * | 8/2004 | Nishimura et al. ......... 257/777 |
| 6,916,682 B2 | * | 7/2005 | Gerber et al. ............... 438/106 |

FOREIGN PATENT DOCUMENTS

| | | |
|---|---|---|
| JP | 06-013541 | 1/1994 |
| JP | 2000-299356 | 10/2000 |
| JP | 2001-110979 | 4/2001 |

OTHER PUBLICATIONS

Communication from Japanese patent Office re: related application.

* cited by examiner

*Primary Examiner*—M. Wilczewski
*Assistant Examiner*—Toniae M. Thomas
(74) *Attorney, Agent, or Firm*—Harness, Dickey & Pierce, P.L.C.

(57) ABSTRACT

A semiconductor device is provided that comprises: a first semiconductor package including a first substrate having a first pad; a second semiconductor package including a second substrate having a second pad which is mounted on the first semiconductor package; and solder provided between the first and second substrates that electrically couples each of the first pads and each of the second pads. Only the solder at the corner portions of the first substrate is covered with resin.

5 Claims, 8 Drawing Sheets

SEMICONDUCTOR DEVICE AND METHOD OF MANUFACTURING THE SAME, CIRCUIT BOARD, AND ELECTRONIC APPARATUS

RELATED APPLICATIONS

This application claims priority to Japanese Patent Application No. 2003-350901 filed Oct. 9, 2003 which is hereby expressly incorporated by reference herein in its entirety.

BACKGROUND

1. Field of the Invention

This invention relates to a semiconductor device and a method of manufacturing the same, a circuit board, and an electronic apparatus.

2. Description of the Related Art

Semiconductor devices in which one or more semiconductor packages having a sealing portion are mounted on another semiconductor package are known. It is also known to attempt electrical conduction between two semiconductor packages by an electric conduction portion provided between the semiconductor packages. By alleviating a force applied to the electric conduction portion, the reliability of the semiconductor device can be increased.

This invention is intended to provide a reliable semiconductor device and a method of manufacturing the same, a circuit board, and an electronic apparatus.

SUMMARY

A semiconductor device according to the present invention comprises: a first semiconductor package including a first substrate having a plurality of first pads and a first semiconductor chip face-down mounted on a face of the first substrate where the first pads in the first substrate are formed; a second semiconductor package including a second substrate having a plurality of second pads, a second semiconductor chip mounted on an opposite side face of the second substrate relative to a face where the second pads in the second substrate are formed, and a sealing portion that seals the second semiconductor chip, wherein the second semiconductor package is mounted on the first substrate so as to overlap the first semiconductor chip and so that the first pads and the second pads face each other; and solder is provided between the first and the second substrates that electrically couples each of the first pads and each of the second pads, wherein only the solder at the corner portions of the first substrate is covered with resin.

According to the present invention, only the solder at the corner portions of the first substrate of the first semiconductor package is covered with resin. That is, only the solder on which stress likely concentrates is covered with resin. For this reason, a semiconductor device can be provided which is highly reliable and in which the quantity of consumed resin is small.

A semiconductor device according to the present invention comprises: a first semiconductor package including a first substrate having a plurality of first pads and a first semiconductor chip face-down mounted on a face of the first substrate where the first pads in the first substrate are formed; a second semiconductor package including a second substrate having a plurality of second pads, a second semiconductor chip mounted on an opposite side face of the second substrate relative to a face where the second pads in the second substrate are formed, and a sealing portion that seals the second semiconductor chip, wherein the second semiconductor package is mounted on the first substrate so as to overlap the first semiconductor chip and so that the first pads and the second pads face each other; and solder is provided between the first and the second substrates that electrically couples each of the first pads and each of the second pads, wherein only the solder at the corner portions of the second substrate is covered with resin.

According to the present invention, only the solder at the corner portions of the second substrate of the second semiconductor package is covered with resin. That is, only the solder on which stress likely concentrates is covered with resin. For this reason, a semiconductor device can be provided which is highly reliable and in which the quantity of consumed resin is small.

A semiconductor device according to the present invention comprises: a first semiconductor package including a first substrate having a plurality of first pads and a first semiconductor chip face-down mounted on a face of the first substrate where the first pads in the first substrate are formed; a second semiconductor package including a second substrate having a plurality of second pads, a second semiconductor chip mounted on an opposite side face of the second substrate relative to a face where the second pads in the second substrate are formed, and a sealing portion that seals the second semiconductor chip, wherein the second semiconductor package is mounted on the first substrate so as to overlap the first semiconductor chip and so that the first pads and the second pads face each other; and solder is provided between the first and the second substrates that electrically couples each of the first pads and each of the second pads, wherein the outline of the second substrate is a rectangle, and only the solder in the end portions of the short side of the second substrate is covered with resin.

According to the present invention, only the solder at the end portions of the short side of the second substrate of the second semiconductor package is covered with resin. That is, only the solder on which stress likely concentrates is covered with resin. For this reason, a semiconductor device can be provided which is highly reliable and in which the quantity of consumed resin is small.

According to this semiconductor device, two or more of the second semiconductor packages may be mounted on the first semiconductor package.

In a circuit board according to the present invention, the above described semiconductor device is mounted.

An electronic apparatus according to the present invention includes the above described semiconductor device.

A method of manufacturing a semiconductor device according to the present invention comprises: providing a first semiconductor package including a first substrate having a plurality of first pads and a first semiconductor chip face-down mounted on a face of the first substrate where the first pads in the first substrate are formed; providing a second semiconductor package including a second substrate having a plurality of second pads, a second semiconductor chip mounted on an opposite side face of the second substrate relative to a face where the second pads in the second substrate are formed, and a sealing portion that seals the second semiconductor chip; mounting the second semiconductor package on the first semiconductor package so that the first semiconductor chip and the second semiconductor package overlap, and so that the first pads and the second pads face each other; providing solder and thermosetting resin between each of the first pads arranged at corner portions of the first substrate and each of the second pads facing the corner portions of the first substrate; providing solder between each of the first pads arranged in regions other than the corner portions of the first substrate, and each of the second pads facing the regions other than the corner portions; and thereafter heating the solder and the thermosetting resin to melt the solder and form an electric conduction portion that electrically couples each of the first pads and each of the second pads, and curing the thermosetting resin while moving the resin outward to form a resin portion that covers each of a plurality of the electric conduction portions arranged at the corner portions of the first substrate.

According to the present invention, a semiconductor device can be manufactured in which only solder at the corner portions of the first substrate of the first semiconductor package is covered with resin. That is, a semiconductor device can be manufactured in which only the solder on which stress likely concentrates is covered with resin. For this reason, it is possible to manufacture a highly reliable semiconductor device with a minimum amount of resin.

A method of manufacturing a semiconductor device according to the present invention comprises: providing a first semiconductor package including a first substrate having a plurality of first pads and a first semiconductor chip face-down mounted on a face of the first substrate where the first pads in the first substrate are formed; providing a second semiconductor package including a second substrate having a plurality of second pads, a second semiconductor chip mounted on an opposite side face of the second substrate relative to a face where the second pads in the second substrate are formed, and a sealing portion that seals the second semiconductor chip; mounting the second semiconductor package on the first semiconductor package so that the first semiconductor chip and the second semiconductor package overlap, and so that the first pads and the second pads face each other; providing solder and thermosetting resin between each of the second pads arranged at corner portions of the second substrate and each of the first pads facing the corner portions of the second substrate; providing solder between each of the second pads arranged in regions other than the corner portions of the second substrate, and each of the first pads facing the regions other than the corner portions of the second substrate; and thereafter heating the solder and the thermosetting resin to melt the solder and form an electric conduction portion that electrically couples each of the first pads and each of the second pads, and curing the thermosetting resin while moving the resin outward to form a resin portion that covers each of the plurality of the electric conduction portions arranged at the corner portions of the second substrate.

According to the present invention, a semiconductor device can be manufactured in which only solder at the corner portions of the second substrate of the second semiconductor package is covered with resin. That is, a semiconductor device can be manufactured in which only the solder on which stress likely concentrates is covered with resin. For this reason, it is possible to manufacture a highly reliable semiconductor device with a minimum amount of resin.

A method of manufacturing a semiconductor device according to the present invention comprises: providing a first semiconductor package including a first substrate having a plurality of first pads and a first semiconductor chip face-down mounted on a face of the first substrate where the first pads in the first substrate are formed; providing a second semiconductor package including a rectangular second substrate having a plurality of second pads, a second semiconductor chip mounted on an opposite side face of the second substrate relative to a face where the second pads in the second substrate are formed and a sealing portion that seals the second semiconductor chip; mounting the second semiconductor package on the first semiconductor package so that the first semiconductor chip and the second semiconductor package overlap, and so that the first pads and the second pads face each other; providing solder and thermosetting resin between each of the second pads arranged at end portions of a short side of the second substrate and each of the first pads facing the end portions of the short side of the second substrate; and providing solder between each of the second pads arranged in regions other than the end portions of the short side of the second substrate, and each of the first pads facing the regions other than the end portions of the short side of the second substrate, and thereafter heating the solder and the thermosetting resin to melt the solder and form an electric conduction portion that electrically couples each of the first pads and each of the second pads, and curing the thermosetting resin while moving the resin outward to form a resin portion that covers each of a plurality of electric conduction portions arranged at the end portions of a short side of the second substrate.

According to the present invention, a semiconductor device can be manufactured in which only solder at the end portions of the short side of the second substrate of the second semiconductor package is covered with resin. That is, a semiconductor device can be manufactured in which only the solder on which stress likely concentrates is covered with resin. For this reason, it is possible to manufacture a highly reliable semiconductor device with a minimum amount of resin.

In the method of manufacturing this semiconductor device, two or more of the second semiconductor packages may be mounted on one first semiconductor package.

DETAILED DESCRIPTION

Hereinafter, embodiments to which the present invention is applied will be described with reference to the accompanying drawings. However, the present invention is not limited to the following embodiments.

First Embodiment

FIG. 1A through FIG. 4 are views for explaining a semiconductor device according to a first embodiment to which the present invention is applied.

Figure 1A:
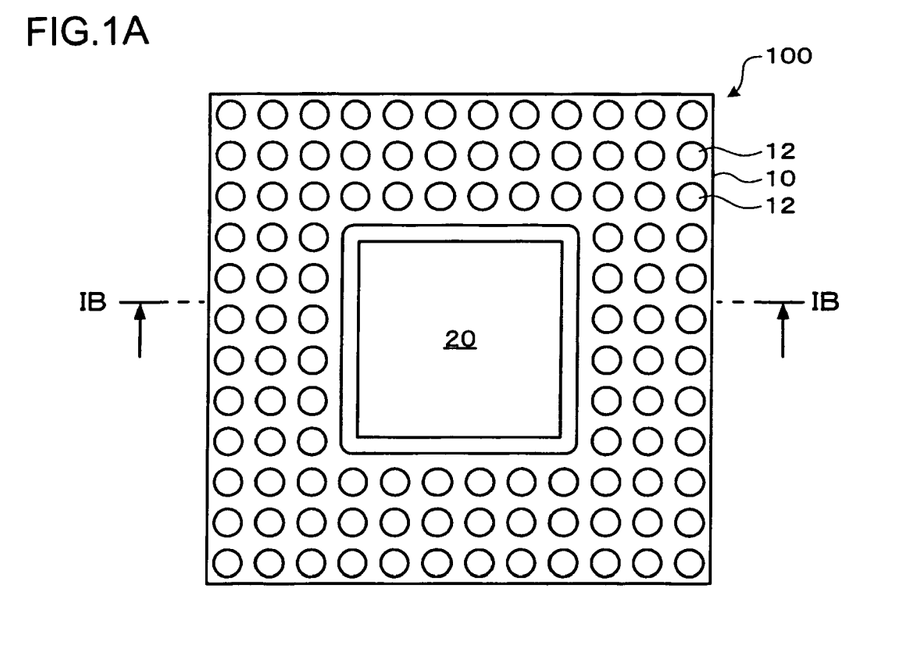
FIG. 1A and FIG. 1B are views for explaining a semiconductor device according to a first embodiment to which the present invention is applied.
Figure 1B:
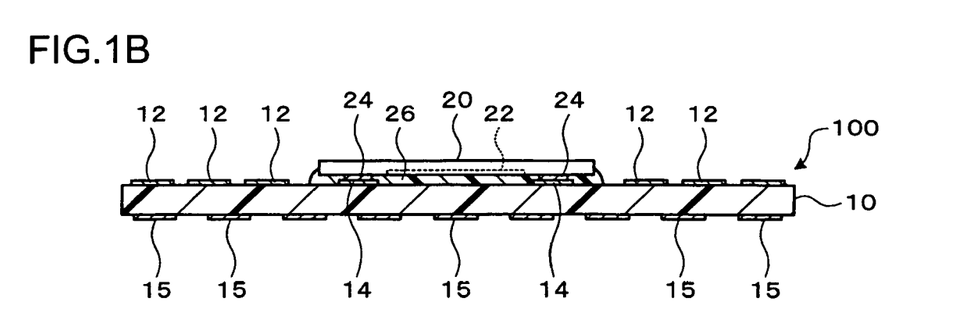

The semiconductor device according to the present embodiment includes a first semiconductor package 100. Hereinafter, the first semiconductor package 100 will be described. In addition, FIG. 1A and FIG. 1B are views for explaining the first semiconductor package 100. Here, FIG. 1A is a plan view of the first semiconductor package 100, and FIG. 1B is an enlarged cross sectional view along the IB—IB line of FIG. 1A.

The first semiconductor package 100 has a first substrate 10. The material of the first substrate 10 is not particularly limited, and may be made as an organic system (for example, an epoxy substrate), an inorganic system (for example, a ceramic substrate, a glass substrate), or a compound structure of these (for example, a glass epoxy substrate). The first substrate 10 may be a rigid substrate, and if so, the first substrate 10 may be called an interposer. Alternatively, the first substrate 10 may be a flexible substrate, such as a polyester substrate or a polyimide substrate. The first substrate 10 may be, for example, a substrate for COF (Chip On Film), or a substrate for TAB (Tape Automated Bonding). Moreover, the first substrate 10 may be a single layer substrate consisted of a single layer, or may be a multi-layered substrate having a plurality of deposited layers. The shape and the thickness of the first substrate 10 are also not particularly limited.

The first substrate 10 has a plurality of first pads 12. The first pad 12 may be formed thin and flat with copper (Cu) or aluminum (Al) for example. Moreover, the plane shape of the first pad 12 is also not particularly limited, and, for example, may be a round shape (see FIG. 1A), or a rectangular shape (not shown). As shown in FIG. 1A and FIG. 1B, the first pad 12 may be arranged to be excluded from a region in which a first semiconductor chip 20 is mounted. Moreover, the first substrate 10 may have a pad 14 (see FIG. 1B). The pad 14 is a pad used for electrical coupling to the first semiconductor chip 20 which will be described later. The pad 14 may be formed on the face where the first pad 12 of the first substrate 10 is formed. The pad 14 may be arranged in the region in which the first semiconductor chip 20 is mounted. The first substrate 10 may further have a pad 15 (see FIG. 1B). An external terminal 18, which will be described later, is provided on the pad 15, and is used for the electric coupling to a mother board or the like. The pad 15 may be formed on the opposite side face relative to the face where the first pad 12 in the first substrate 10 is formed.

The first semiconductor package 100 has a first semiconductor chip 20, as shown in FIG. 1A and FIG. 1B. The first semiconductor chip 20 may have an integrated circuit 22 including a transistor, a memory element or the like. The first semiconductor chip 20 may have furthermore an electrode 24. The electrode 24 may be electrically coupled to the inside of the first semiconductor chip 20. The first semiconductor chip 20 is face-down mounted on the first substrate 10. In particular, as shown in FIG. 1B, the first semiconductor chip 20 is mounted so that the face (active side), in which the integrated circuit 22 is formed, faces the first substrate 10. The first semiconductor chip 20 is mounted on the face where the first pad 12 is formed in the first substrate 10. Then, the electrode 24 and the pad 14 are electrically coupled facing each other. As shown in FIG. 1A and FIG. 1B, the first semiconductor chip 20 may be fixed to the first substrate 10 by a resin portion 26.

Figure 2A:
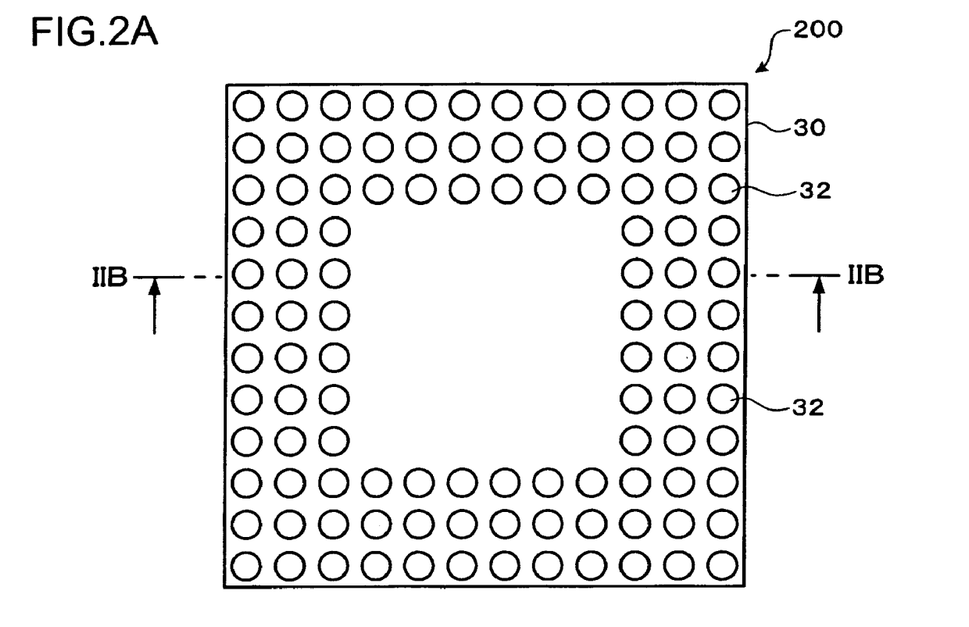
FIG. 2A and FIG. 2B are views for explaining the semiconductor device according to the first embodiment to which the present invention is applied.
Figure 2B:
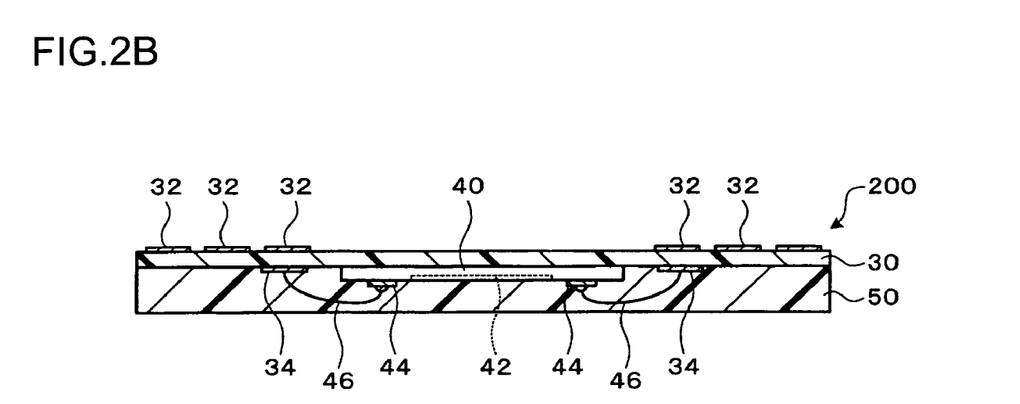

The semiconductor device according to the present embodiment includes a second semiconductor package 200. Hereinafter, the second semiconductor package 200 will be described. In addition, FIG. 2A and FIG. 2B are views for explaining the second semiconductor package 200. Here, FIG. 2A is a plan view of the second semiconductor package 200, and FIG. 2B is an enlarged cross sectional view along the IIB—IIB line of FIG. 2A.

The second semiconductor package 200 has a second substrate 30. The material or the structure of the second substrate 30 is not particularly limited, and any one of the systems described with respect to the first substrate 10 may be applied.

The second substrate 30 has a plurality of second pads 32. As for the material and the shape of the second pad 32, any one of the shapes and materials described with respect to the first pad 12 may be applied. The second pad 32 is arranged so as not to overlap the first semiconductor chip 20 at the time of mounting the second semiconductor package 200 on the first semiconductor package 100 (see FIG. 3B). In other words, the second pad 32 is arranged to be excluded from the region which overlaps the first semiconductor chip 20 in the second substrate 30. The second substrate 30 may furthermore have a pad 34. The pad 34 is a pad used for electrical coupling with a second semiconductor chip 40, which will be described later. The pad 34 may be formed on the opposite side face of the second substrate 30 relative to the face where the second pad 32 of the second substrate 30 is formed.

The second semiconductor package 200 has the second semiconductor chip 40. The second semiconductor chip 40 may have an integrated circuit 42. The second semiconductor chip 40 may also have an electrode 44. The electrode 44 may be electrically coupled to the inside of the second semiconductor chip 40. The second semiconductor chip 40 is mounted on the opposite side face of the second substrate relative to 30 the face where the second pad 32 is formed in the second substrate 30. That is, the second semiconductor chip 40 may be mounted on the face where the pad 34 in the second substrate 30 is formed. The second semiconductor chip 40 may be, for example, face-up bonded on the second substrate 30. That is, as shown in FIG. 2B, the second semiconductor chip 40 may be mounted so that the opposite side face of the face (active face), in which the integrated circuit 42 is formed, faces the second substrate 30. An electrode 44 of the second semiconductor chip 40 and the pad 34 of the second substrate 30 may be electrically coupled by wire 46. However, the configuration of mounting the second semiconductor chip 40 is not limited to this. Moreover, one second semiconductor package 200 may have a plurality of second semiconductor chips 40. In this case, the second semiconductor chip 40 may be deposited (not shown).

The second semiconductor package 200 has a sealing portion 50 (see FIG. 2B). The sealing portion 50 is formed on the side in which the second semiconductor chip 40 on the second substrate 30 is mounted. Then, the sealing portion 50 seals the second semiconductor chip 40. The sealing portion 50 may further seal the pad 34 and the wire 46.

Figure 3A:
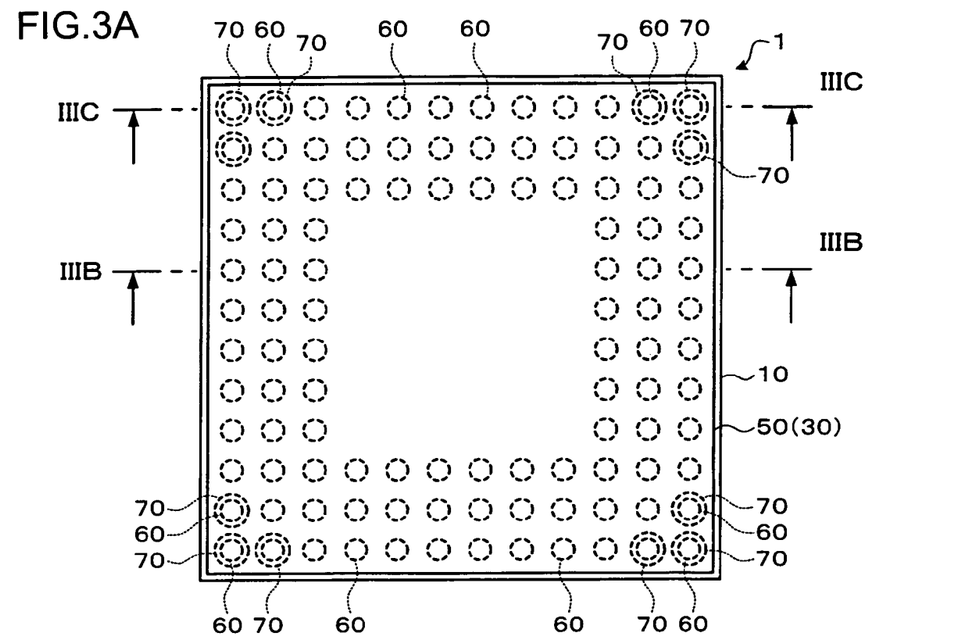
FIG. 3A through FIG. 3C are views for explaining the semiconductor device according to the first embodiment to which the present invention is applied.
Figure 3B:
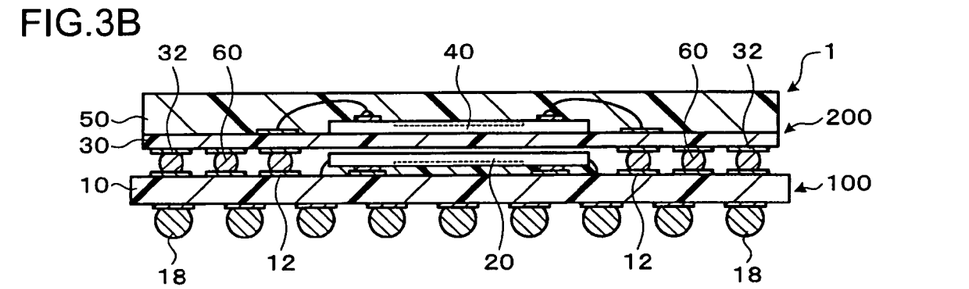
Figure 3C:
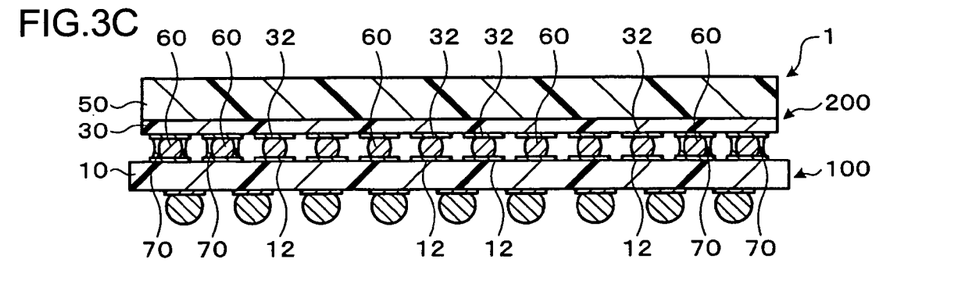

In a semiconductor device according to the present embodiment, the second semiconductor package 200 is mounted on the first semiconductor package 100 (see FIG. 3A through FIG. 3C). The second semiconductor package 200 is mounted so as to overlap the first semiconductor chip 20 (see FIG. 3B). The second semiconductor package 200 is mounted so that the first pad 12 and the second pad 32 face each other (see FIG. 3B and FIG. 3C). In addition, FIG. 3A through FIG. 3C are views showing a semiconductor device 1 according to the present embodiment. Here, FIG. 3A is a plan view of the semiconductor device 1. However, for simplicity, the pads (particularly, pads 12, 14, 15, 32, and 34) and the semiconductor chips (the first and second semiconductor chips 20 and 40) are omitted. Then, FIG. 3B is an enlarged cross sectional view along the IIIB—IIIB line of FIG. 3A, and FIG. 3C is an enlarged cross sectional view along the IIIC—IIIC line of FIG. 3A.

The semiconductor device according to the present embodiment includes a plurality of solder (units) 60, as shown in FIG. 3A through FIG. 3C. The solder 60 is provided between the first and second substrates 10 and 30. With each solder 60, each of the first pads 12 and each of the second pads 32 are electrically coupled.

In the semiconductor device according to the present embodiment, only the solder 60 at the corner portions of the first substrate 10 is covered with resin 70 (see FIG. 3A and FIG. 3C). As described above, the semiconductor device according to the present embodiment has a structure where the second semiconductor package 200 is mounted on the first semiconductor package 100. The second semiconductor package 200 has a structure with the sealing portion 50, while the first semiconductor package 100 has a structure without a sealing portion. In the semiconductor device with such a structure, there are cases where the expansion coefficients of the first substrate 10 and the second substrate 30 differ due to the influence of the sealing portion 50 or the like. Because of this, there are cases where a force may be applied to the solder 60 provided between the first pad 12 and the second pad 32. Particularly, there are cases where, near the corner portions of the first substrate 10, a large force is applied to the solder 60. In the semiconductor device according to the present embodiment, only each solder 60 at the corner portions of the first substrate 10 is covered with the resin 70. Accordingly, the solder 60 is only reinforced in the region on which stress likely concentrates and, advantageously, the reliability of the semiconductor device can be increased by a minimum amount of the resin 70. For this reason, reliable semiconductor devices can be manufactured at an inexpensive price. Moreover, in the semiconductor device according to the present embodiment, a positional offset of the first and second semiconductor packages 100 and 200, can be prevented with the resin 70, therefore, reliable semiconductor devices can be provided. In addition, in the semiconductor device according to the present embodiment, as shown in FIG. 3A, multiple pieces (three pieces for each, in FIG. 3A) of solder 60 covered with the resin 70 may be provided in each corner portion of the first substrate 10. However, as an alternative, only one piece of solder 60 covered with the resin 70 may be provided in each corner portion of the first substrate 10 (not shown).

Figure 4:
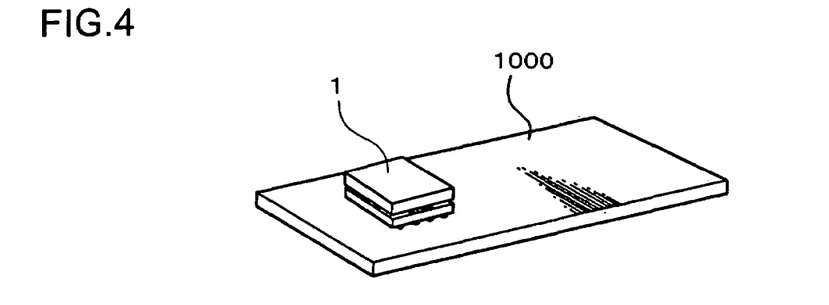
FIG. 4 is a view for showing a circuit board in which the semiconductor device according to the embodiment to which the present invention is applied, is mounted.

The semiconductor device according to the present embodiment may have an external terminal 18, as shown in FIG. 3B and FIG. 3C. The external terminal 18 may be provided on the pad 15 of the first substrate 10. In FIG. 4, a circuit board 1000 is shown where the semiconductor device 1 is mounted according to the embodiment to which the present invention is applied.

Figure 5A:
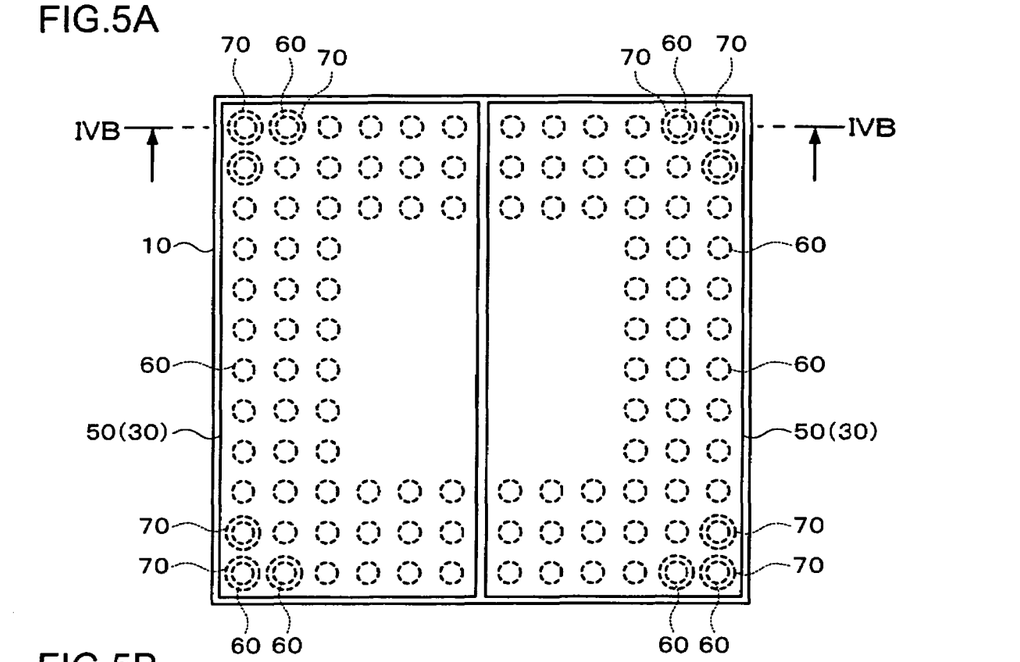
FIG. 5A and FIG. 5B are views for explaining the semiconductor device according to a modification of the first embodiment to which the present invention is applied.
Figure 5B:
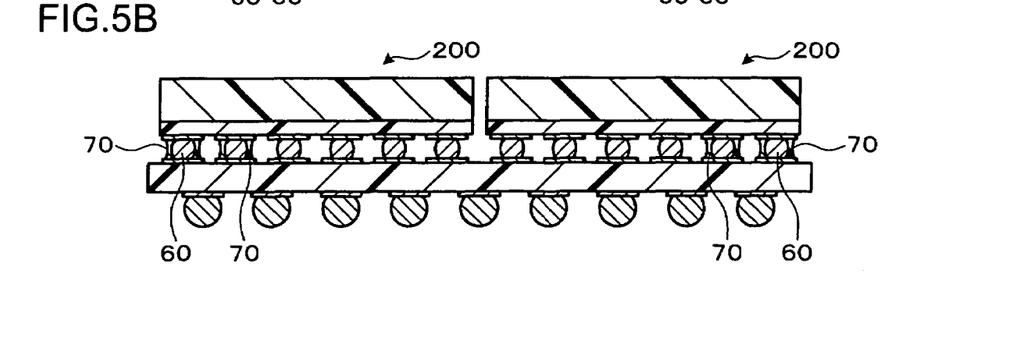

The semiconductor device 1 according to the present embodiment is constituted as described above. Incidentally, the semiconductor device according to the first embodiment, to which the present invention is applied, is not limited to this, and various modifications can be made. For example, as shown in FIG. 6A and FIG. 5B, in one first semiconductor package 100, two or more of the second semiconductor packages 200 may be mounted. Because the same effect can also be obtained by this arrangement, a semiconductor device which has a number of semiconductor chips and is highly reliable can be provided. FIG. 5A is a plan view of a semiconductor device according to a modification of the first embodiment to which the present invention is applied. FIG. 5B is an enlarged cross sectional view along the VB—VB line of FIG. 5A.

Figure 6:
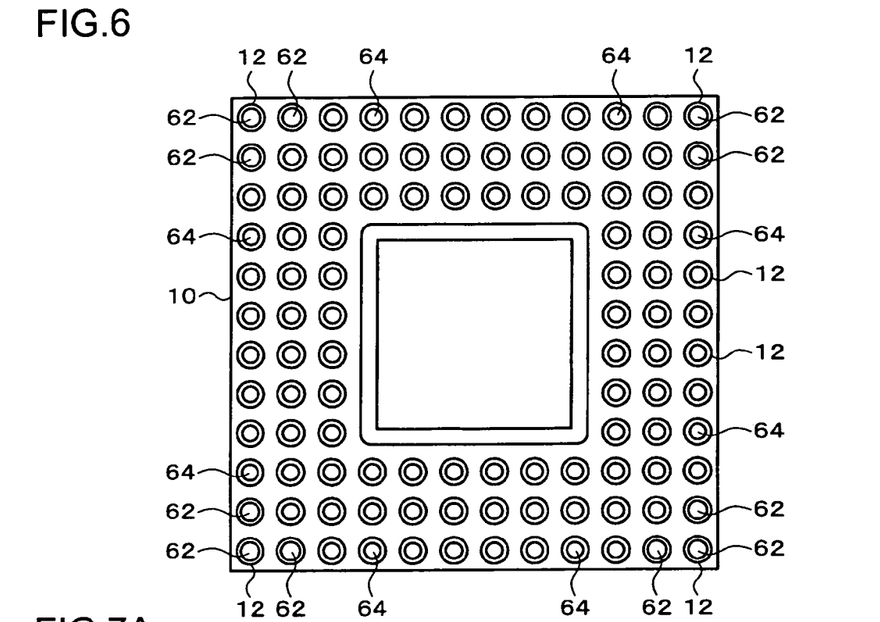
FIG. 6 is a view for explaining a method of manufacturing the semiconductor device according to the first embodiment to which the present invention is applied.
Figure 7A:
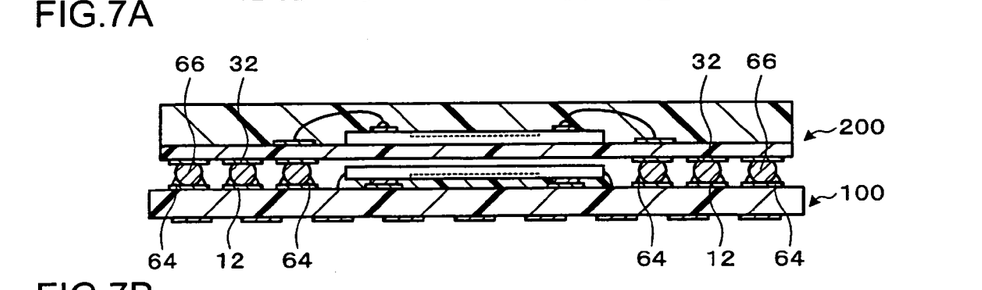
FIG. 7A and FIG. 7B are views for explaining the method of manufacturing the semiconductor device according to the first embodiment to which the present invention is applied.
Figure 7B:
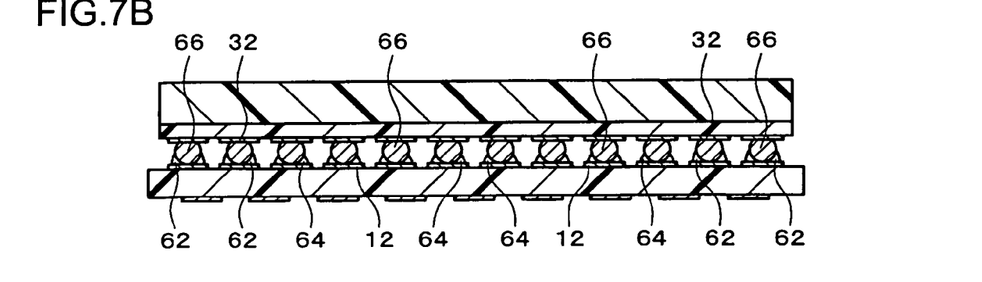

Hereinafter, a method of manufacturing the semiconductor device according to the present embodiment will be described. FIG. 6 through FIG. 7B are views for explaining the method of manufacturing the semiconductor device according to the first embodiment to which the present invention is applied.

A method of manufacturing the semiconductor device according to the present embodiment includes providing the first semiconductor package 100 and the second semiconductor package 200. The structures of the first and second semiconductor packages 100, 200 are as explained earlier. The first and second semiconductor packages 100, 200 may be made by applying any known method.

The method of manufacturing the semiconductor device according to the present embodiment includes mounting the second semiconductor package 200 on the first semiconductor package 100 (see FIG. 7A and FIG. 7B). As shown in a FIG. 6, pastes 62 and 64 may be provided to the first pad 12 of the first semiconductor package 100. Particularly, the paste 62 may be provided on each of the first pads 12 arranged at the corner portions of the first substrate 10. In addition, in the method of manufacturing the semiconductor device according to the present embodiment, as shown in FIG. 6, the paste 62 may be provided on the plurality of first pads 12 (three pieces in the example shown in FIG. 6) arranged at each corner portion of the first substrate 10. Or, the paste 62 may be provided only on one first pad 12 arranged at each corner portion of the first substrate 10 (not shown). Here, the paste 62 contains resin such as thermosetting resin. The paste 62 may also include solder. Moreover, the paste 64 may be provided in each of the first pads 12 arranged in the regions other than the corner portions of the first substrate 10. Here, the paste 64 does not contain resin such as thermosetting resin. The paste 64 may be, for example, solder paste. Moreover, the pastes 62 and 64 may furthermore contain flux. Then, a solder ball 66 may be provided on each of the second pads 32 of the second semiconductor package 200. Then, the second semiconductor package 200 may be mounted on the first semiconductor package 100. FIG. 7A and FIG. 7B are cross sectional views showing a multi-layered condition of the first and second semiconductor packages 100, 200. As shown in FIG. 7A, the second semiconductor package 200 is mounted so that the first semiconductor chip 20 and the second semiconductor package 200 overlap. As shown in FIG. 7B, the second semiconductor package 200 is mounted so that the first pad 12 and the second pad 32 face each other.

In addition, the method of mounting the second semiconductor package 200 on the first semiconductor package 100 is not limited to this. Namely, the second semiconductor package 200 may be mounted on the first semiconductor package 100 with either: a method capable of providing solder and (e.g., thermosetting) resin between each of the first pads 12 arranged at the corner portions of the first substrate 10 and each of the second pads 32 that faces the corner portions; or a method capable of providing solder between each of the first pads 12 arranged in regions other than the corner portions of the first substrate 10 and each of the second pads 32 that faces these other regions.

The method of manufacturing the semiconductor device according to the present embodiment includes heating the solder and the thermosetting resin. For example, as shown in FIG. 7A and FIG. 7B, after the first semiconductor package 100 and second semiconductor package 200 are joined, the solder ball 66 and pastes 62 and 64 may be heated. By heating the solder ball 66 and melts, the electric conduction portion (solder 60), which electrically couples each of the first pads 12 and each of the second pads 32, is formed. In addition, in the case where the pastes 62 and 64 contain solder, the electric conduction portion (solder 60) may be formed by melting the solder. Then, by heating the thermosetting resin contained in the paste 62, this resin is cured and at the same time is moved outward. Thus, the resin 70, which covers each of a plurality of the electric conduction portions (solder 60) arranged at the corner portions of the first substrate 10, is formed.

The semiconductor device 1 may be manufactured through a process of providing external terminals, an inspection process, or the like (see FIG. 3A through FIG. 3C). In addition, two or more of the second semiconductor packages 200 may be mounted on one first semiconductor package 100, and thereby semiconductor devices according to the modification of the present embodiment may be manufactured (see FIG. 5A and FIG. 5B).

Second Embodiment

Figure 8A:
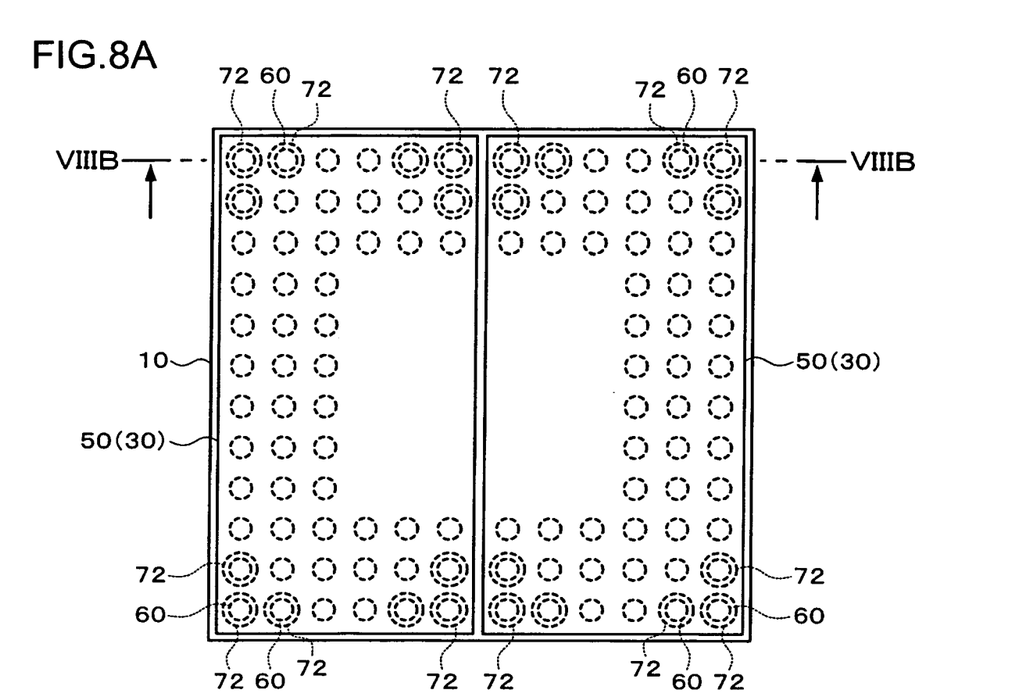
FIG. 8A and FIG. 8B are views for explaining a semiconductor device according to a second embodiment to which the present invention is applied.
Figure 8B:
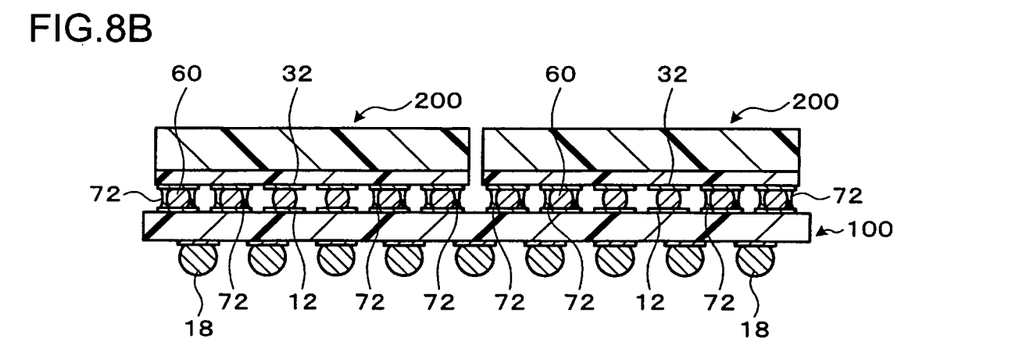

FIG. 8A and FIG. 8B are views for explaining a semiconductor device according to a second embodiment to which the present invention is applied. Content already described shall be applied to this embodiment, as much as possible.

The semiconductor device according to the present embodiment includes the first and the second semiconductor packages 100, 200, and the solder 60. As for the content thereof, the contents already described may be applied. The second package 200 is mounted on the first package 100. As for the semiconductor device according to the present embodiment, as shown in FIG. 8A and FIG. 8B, two first semiconductor packages 200 may be mounted on one first semiconductor package 100. Alternatively, one second semiconductor package 200 may be mounted on one first semiconductor package 100 (see FIG. 3A). Then, with the solder 60, the first pad 12 and the second pad 32 are electrically coupled.

In the semiconductor device according to the present embodiment, only each solder 60 at the corner portions of the second substrate 30 is covered with the resin 72 (see FIG. 8A and FIG. 8B). As described earlier, the semiconductor device according to the present embodiment has a structure where the second semiconductor package 200 is mounted on the first package 100. There are cases where a force may be applied to the solder 60 provided between the first pad 12 and the second pad 32. In particularly, near the corner portions of the second substrate 30, there are cases where a large force is applied to the solder 60. In the semiconductor device according to the present embodiment, only the solder 60 at the corner portions of the second substrate 30 is covered with the resin 70. Accordingly, the solder 60 is only reinforced in the region on which stress likely concentrates and, advantageously, the reliability of the semiconductor device can be increased with a minimum amount of the resin 70.

The semiconductor device according to the present embodiment is constituted as described above. Hereinafter, the method of manufacturing this semiconductor device will be described. The method of manufacturing the semiconductor device according to the present embodiment includes providing the first and the second semiconductor packages 100, 200. The method of manufacturing the semiconductor device includes mounting the second semiconductor package 200 on the first semiconductor package 100 so that the first semiconductor chip 20 and the second semiconductor package 200 overlap, and the first pad 12 and second pad 32 face each other. The method of manufacturing the semiconductor device includes providing solder and (e.g., thermosetting) resin between each of the second pads 32 arranged at the corner portions of the second substrate 30, and each of the first pads 12 that faces the corner portions. The method of manufacturing the semiconductor device includes providing solder between each of the second pads 32 arranged in regions other than the corner portions of the second substrate 30 and each of the first pads 12 that faces these other regions. The method of manufacturing the semiconductor device includes heating the solder and the thermosetting resin, forming the electric conduction portion (solder 60) which electrically couples each of the first pads 12 and each of the second pads 32; and forming the resin 72 which covers each of a plurality of the electric conduction portions (solder 60) arranged at the corner portions of the second substrate 30. In particularly, the solder is heated and melts, and the electric conduction portion (solder 60), which electrically couples each of the first pads 12 and each of the second pads 32, is formed. Then, by heating the thermosetting resin, the thermosetting resin is cured and at the same time is moved outward, and the resin portion 72, which covers each of the plurality of the electric conduction portions (solder 60) arranged at the corner portions of the second substrate 30, is formed.

Third Embodiment

Figure 9A:
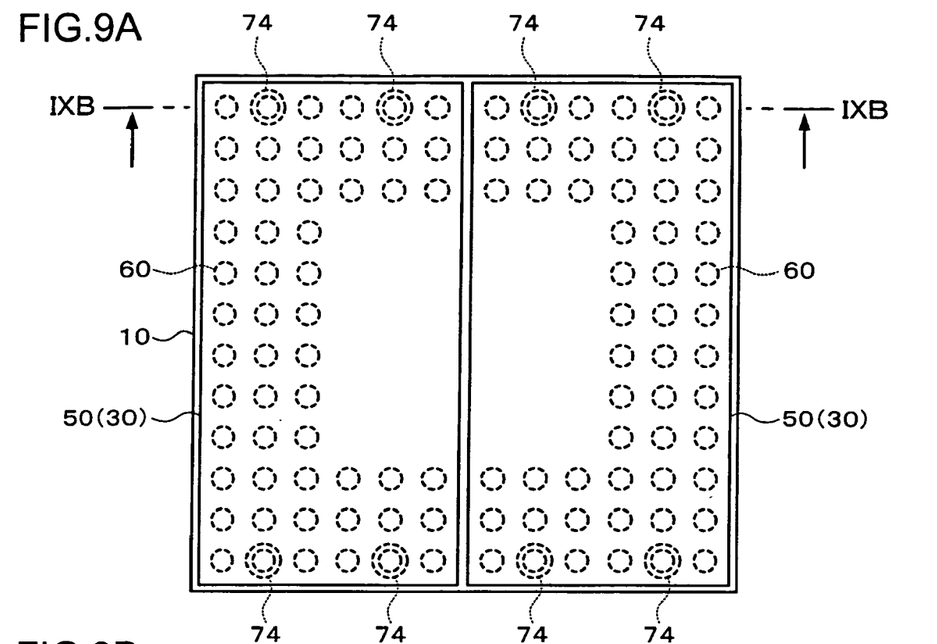
FIG. 9A and FIG. 9B are views for explaining the semiconductor device according to the second embodiment to which the present invention is applied.
Figure 9B:
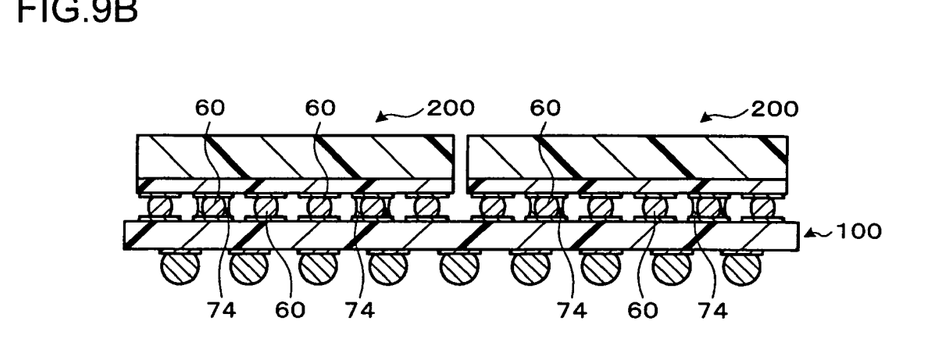

FIG. 9A and FIG. 9B are views for explaining a semiconductor device according to a third embodiment to which the present invention is applied. The contents already described shall be applied to the present embodiment as much as possible.

The semiconductor device according to this embodiment includes the first and the second semiconductor packages 100, 200, and the solder 60. Incidentally, as for the content thereof, the contents already described may be applied. However, in this embodiment, the outline of the second substrate 30 of the second semiconductor package 200 is a rectangle. The second package 200 is mounted on the first package 100. As for the semiconductor device according to this embodiment, as shown in FIG. 9A and FIG. 9B, two second semiconductor packages 200 may be mounted on one first semiconductor package 100. However, one second semiconductor package 200 may be mounted on one semiconductor package 100 (not shown). Then, with the solder 60, the first pad 12 and the second pad 32 are electrically coupled.

In the semiconductor device according to the present embodiment, only the solder 60 at the end portions of the short side of the rectangular second substrate 30 is covered with the resin 74 (see FIG. 9A and FIG. 9B). If desired, only two or more (two, in FIG. 9A and FIG. 9B) of the solder 60 at the end portion of each short side of the second substrate 30 may be covered with the resin 74. Moreover, if desired, all the solder 60 arranged at the end portions of each short side may be covered with the resin 74. Still alternatively, only one solder 60 arranged at the end portion of each short side may be covered with the resin 74 (not shown). As described earlier, the semiconductor device according to the present embodiment has a structure where the second semiconductor package 200 is mounted on the first package 100. There are cases where a force may be applied to the solder 60 provided between the first pad 12 and the second pad 32. Especially, in the case where the outline of the second substrate 30 is a rectangle, near the end portions of the short side of the outline of the second substrate 30, there are cases where a large force is applied to the solder 60. In the semiconductor device according to the present embodiment, only the solder 60 at the end portions of the short side of the outline of the second substrate 30 is covered with the resin 74. Accordingly, the solder 60 is only reinforced in the region on which stress likely concentrates and, advantageously, the reliability of the semiconductor device can be increased with a minimum amount of the resin.

The semiconductor device according to the present embodiment is constituted as described above. Hereinafter, the method of manufacturing the same will be described. The method of manufacturing the semiconductor device according to the present embodiment includes providing the first and the second semiconductor packages 100, 200. In addition, in the method of manufacturing the semiconductor device according to the present embodiment, the outline of the second substrate 30 of the second semiconductor package 200 is a rectangle. The method of manufacturing the semiconductor device includes mounting the second semiconductor package 200 on the first semiconductor package 100 so that the first semiconductor chip 20 and the second semiconductor package 200 overlap, and the first pad 12 and the second pad 32 face to each other. The method of manufacturing the semiconductor device includes providing solder and (e.g., thermosetting) resin between each of the second pads 32 arranged at the end portions of the short side of the second substrate 30, and each of the first pads 12 that faces the end portions. The method of manufacturing the semiconductor device includes providing solder between each of the second pads 32 arranged in regions other than the end portions of the short side of the second substrate 30, and each of the first pads 12 that faces these other regions. The method of manufacturing the semiconductor device includes heating the solder and the thermosetting resin, forming the electric conduction portion (solder 60) which electrically couples each of the first pads 12 and each of the second pads 32, and forming the resin 74 which covers each of the plurality of the electric conduction portions (solder 60) arranged at the end portions of the second substrate 30. In particularly, the solder is heated and melts, and the electric conduction portion (solder 60) which electrically couples each of the first pads 12 and each of the second pads 32 is formed. Then, by heating the thermosetting resin, the thermosetting resin is cured and at the same time moved outward. Thus, the resin portion 74, which covers each of the plurality of the electric conduction portions (solder 60) arranged at the end portions of the short side of the second substrate 30, is formed.

Figure 10:
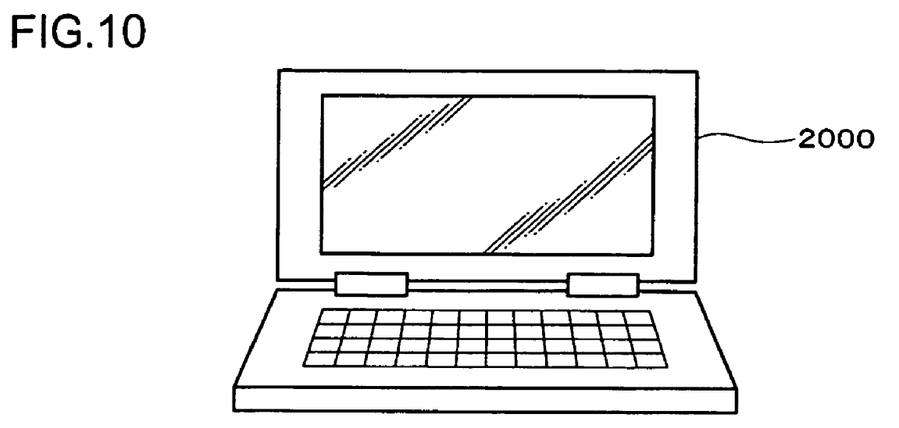
FIG. 10 is a view showing an electronic apparatus having the semiconductor device according to the embodiment to which the present invention is applied.
Figure 11:
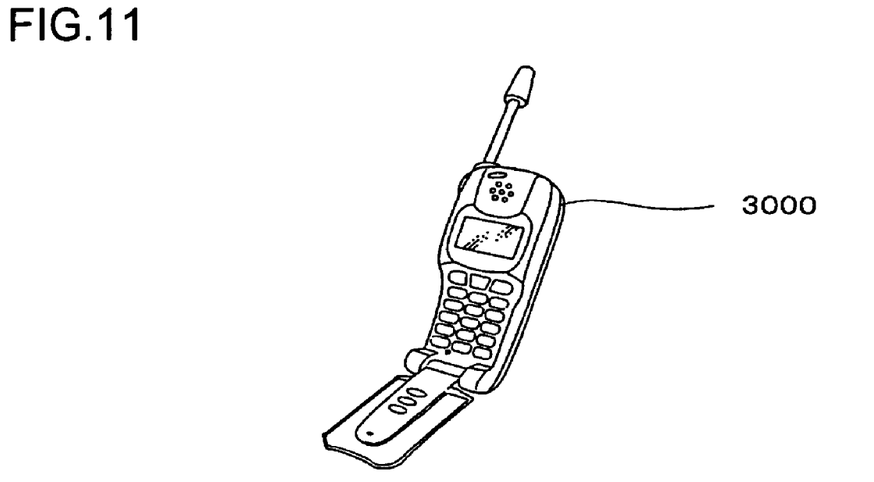
FIG. 11 is a view showing an electronic apparatus having the semiconductor device according to the embodiment to which the present invention is applied.

Finally, as an electronic apparatus having a semiconductor device according to the embodiment to which the present invention is applied, a notebook type personal computer 2000 is shown in FIG. 10, and a cellular phone is shown in FIG. 11, respectively.

The present invention is not limited to the above described embodiments, and various modifications can be made. For example, the present invention includes substantially the same structure (for example, structures, whose function, method and result are the same, or structures whose objective and effect are the same) as the ones described in the embodiments. Moreover, the present invention includes structures that replace non-essential portions in the structures described in the embodiments. Moreover, the present invention includes structures that perform the same operational effect, or structures that can attain the same objective, as the structures described in the embodiments. Moreover, the present invention includes structures in which known technologies are applied to the structures described in the embodiments.

What is claimed is:

1. A semiconductor device, comprising:
   a first semiconductor package including:
      a first substrate having a plurality of first pads; and
      a first semiconductor chip face-down mounted on a face of the first substrate where the first pads in the first substrate are formed;
   at least two second semiconductor packages each including:
      a second substrate having a plurality of second pads;
      a second semiconductor chip mounted on an opposite side face of the second substrate relative to a face where the second pads in the second substrate are formed; and
      a sealing portion that seals the second semiconductor chip;
      wherein the at least two second semiconductor packages are horizontally adjacent to each other and are mounted on the first substrate so as to overlap the first semiconductor chip and so that the first pads and the second pads face each other; and
   solder provided between the first and the second substrates that electrically couples each of the first pads and each of the second pads;
   wherein only the solder at corner portions of the first substrate is covered with resin.

2. A semiconductor device, comprising:
   a first semiconductor package including:
      a first substrate having a plurality of first pads; and
      a first semiconductor chip face-down mounted on a face of the first substrate where the first pads in the first substrate are formed;
   at least two second semiconductor packages each including:
      a second substrate having a plurality of second pads;
      a second semiconductor chip mounted on an opposite side face of the second substrate relative to a face where the second pads in the second substrate are formed; and
      a sealing portion that seals the second semiconductor chip;
      wherein the at least two second semiconductor packages are horizontally adjacent to each other and are mounted on the first substrate so as to overlap the first semiconductor chip and so that the first pads and the second pads face each other; and
   solder provided between the first and the second substrates that electrically couples each of the first pads and each of the second pads;
   wherein only the solder at the corner portions of the second substrate is covered with resin.

3. A semiconductor device, comprising:
a first semiconductor package including:
   a first substrate having a plurality of first pads; and
   a first semiconductor chip face-down mounted on a face of the first substrate where the first pads in the first substrate are formed;
at least two second semiconductor packages each including:
   a second substrate having a plurality of second pads;
a second semiconductor chip mounted on an opposite side face of the second substrate relative to a face where the second pads in the second substrate are formed; and
   a sealing portion that seals the second semiconductor chip;
   wherein the at least two second semiconductor packages are horizontally adjacent to each other and are mounted on the first substrate so as to overlap the first semiconductor chip and so that the first pads and the second pads face each other; and
solder provided between the first and the second substrates that electrically couples each of the first pads and each of the second pads;
wherein an outline of the second substrate is a rectangle, and only the solder in the end portions of a short side of the second substrate is covered with resin.

4. A circuit board comprising:
a board; and
the semiconductor device according to claim 1 mounted to the board.

5. An electronic apparatus comprising the semiconductor device according to claim 1.

* * * * *